United States Patent
Wu et al.

(10) Patent No.: US 8,872,157 B2
(45) Date of Patent: Oct. 28, 2014

(54) NITRIDE SEMICONDUCTOR STRUCTURE AND SEMICONDUCTOR LIGHT EMITTING DEVICE INCLUDING THE SAME

(71) Applicant: Genesis Photonics Inc., Tainan (TW)

(72) Inventors: Jyun-De Wu, Tainan (TW); Yu-Chu Li, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 13/963,118

(22) Filed: Aug. 9, 2013

(65) Prior Publication Data

US 2014/0138618 A1    May 22, 2014

(30) Foreign Application Priority Data

Nov. 19, 2012   (TW) .............................. 101143155 A

(51) Int. Cl.
  *H01L 33/14*    (2010.01)
  *H01L 33/06*    (2010.01)
  *H01L 33/32*    (2010.01)

(52) U.S. Cl.
  CPC ................ *H01L 33/06* (2013.01); *H01L 33/14* (2013.01); *H01L 33/32* (2013.01)
  USPC .......... 257/13; 257/43; 257/94; 257/E29.089; 438/2; 438/29; 438/46; 438/47

(58) Field of Classification Search
  CPC ....................................... H01L 33/32
  USPC .......... 257/13, 43, 94, 96, 190, 615, E29.089, 257/E33.023; 438/2, 29, 46–47, 478–509
  See application file for complete search history.

(56) References Cited

U.S. PATENT DOCUMENTS

| | | | |
|---|---|---|---|
| 2010/0034231 A1* | 2/2010 | Fukuda et al. | 372/49.01 |
| 2010/0289067 A1* | 11/2010 | Mishra et al. | 257/268 |
| 2011/0001126 A1* | 1/2011 | Kamikawa et al. | 257/14 |

* cited by examiner

*Primary Examiner* — Mark A Laurenzi
(74) *Attorney, Agent, or Firm* — Rosenberg, Klein & Lee

(57) ABSTRACT

A nitride semiconductor structure and a semiconductor light emitting device including the same are revealed. The nitride semiconductor structure includes a light emitting layer disposed between a n-type semiconductor layer and a p-type semiconductor layer, and a hole supply layer disposed between the light emitting layer and the p-type semiconductor layer. The hole supply layer is made from material $In_xGa_{1-x}N$ ($0<x<1$) and is doped with a Group IV-A element at a concentration ranging from $10^{17}$ to $10^{20}$ cm$^{-3}$. By being doped with the Group IV-A element, the concentration of holes is increased and inactivation caused by Mg—H bonds is reduced. Thus Mg is activated as acceptors and the light emitting efficiency is further increased.

11 Claims, 2 Drawing Sheets

NITRIDE SEMICONDUCTOR STRUCTURE AND SEMICONDUCTOR LIGHT EMITTING DEVICE INCLUDING THE SAME

BACKGROUND OF THE INVENTION

1. Field of the Invention

The present invention relates to a nitride semiconductor structure and a semiconductor light emitting device, especially to a nitride semiconductor structure with a hole supply layer, and a semiconductor light emitting device with a better light emitting efficiency due to additional holes provided.

2. Description of Related Art

In recent years, light emitting diodes (LED) have become more important in our daily lives due to their broad applications. LED is going to replace most of lighting devices available now and becoming a solid lighting element for the next generation. It's a trend to develop high energy saving, high efficiency and high power LED. Nitride LED has become one of the most popular optoelectronic semiconductor materials due to the advantages of compact volume, mercury-free, high efficiency and long service life. The wavelength of III-nitride almost covers the wavelength range of visible light so that it is a LED material with great potential.

The Group III nitrides such as InN, GaN, AlN, etc play an important role in optoelectronic semiconductor devices due to their wide band gap. The energy gap ranges from InN with a direct band gap of 0.7 eV to GaN with a direct band gap of 3.4 eV, and even 6.2 eV of AlN and the emission wavelength covers from red, through green blue to deep UV region. As to Group III-Nitride semiconductors used as light emitting devices, a p-n junction structure is required. The p-n junction is formed between a n-type semiconductor layer and a p-type semiconductor layer. The n-type semiconductor layer is formed by a semiconductor layer doped with n-type dopant such as Si, Sn, etc while the p-type semiconductor layer is formed by a semiconductor layer doped with p-type dopant such as Mg. However, Mg easily reacts with hydrogen atoms to form Mg—H complexes. Thus the p-type dopant is unable to act as acceptors and the concentration of holes provided is significantly reduced. Therefore the light emitting devices are unable to work well, and a p-type nitride semiconductor layer having a low resistance is difficult to be produced by conventional techniques.

For example, while producing semiconductor layers made from the p-type nitride (such as GaN), ammonia gas (NH$_3$) is used as a source of nitrogen atoms. During the epitaxial process (such as vapor deposition), ammonia gas is decomposed into nitrogen atoms and hydrogen atoms. The hydrogen atoms react and bond with the p-type dopant (such as Mg) used as acceptors in the above semiconductor layer. Thus the p-type dopant loses its activity and the doped concentration is unable to be increased. Moreover, activation energy (Ea) of Mg in GaN is quite large so that the hole activation is less than 10%. Thus it's difficult to raise the hole concentration of the p-type GaN. In order to get high hole concentration, reduction of the Mg—H bonds is required. Therefore the p-type GaN with a sufficiently low resistance is able to provide a better light emitting efficiency.

Thus there is a room for improvement and a need to provide a novel nitride semiconductor structure and a semiconductor light emitting device including the same that overcome the above shortcomings.

SUMMARY OF THE INVENTION

Therefore it is a primary object of the present invention to provide a nitride semiconductor structure in which a hole supply layer being doped with a Group IV-A element so as to increase a concentration of holes and reduce inactivation caused by Mg—H bonds. The Mg is activated to act as acceptors so that the hole supply layer has higher concentration of holes. Thereby more holes are provided and entering a light emitting layer and the electron-hole recombination is increased. Thus a better light emitting efficiency is obtained.

It is another object of the present invention to provide a semiconductor light emitting device including the above nitride semiconductor structure.

In order to achieve above objects, a nitride semiconductor structure of the present invention includes an n-type semiconductor layer, a p-type semiconductor layer, an light emitting layer disposed between the n-type semiconductor layer and the p-type semiconductor layer, a hole supply layer disposed between the light emitting layer and the p-type semiconductor layer. The hole supply layer is made from In$_x$Ga$_{1-x}$N (0<x<1 while 0<x≤0.1 is preferred). Moreover, the hole supply layer is doped with a Group IV-A element at a concentration ranging from $10^{17}$ to $10^{20}$ cm$^{-3}$. Once the concentration of the Group IV-A element is smaller than $10^{17}$ cm$^{-3}$, they are unable to provide holes. If the concentration of the Group IV-A element is larger than $10^2$ cm$^{-3}$, this leads to an increased resistance. Thus the preferred doping concentration is ranging from $8\times10^{17}$ to $5\times10^{18}$ cm$^{-3}$. The Group IV-A element can be carbon.

Besides the Group IV-A element, the hole supply layer can also be doped with a p-type dopant at a concentration higher than $10^{18}$ cm$^{-3}$. The optimal thickness of the hole supply layer is ranging from 1 nm to 100 nm. The p-type dopant can be magnesium.

The multiple quantum well (MQW) structure of the light emitting layer is formed by InGaN well layers and GaN barrier layers stacked alternately. The band gap of the hole supply layer is larger than that of the well layer in the MQW structure. Thus holes can enter the well layer of the MQW structure to increase the electron-hole recombination rate and further improve the light emitting efficiency.

A p-type carrier blocking layer (such as p-AlGaN) is disposed between the p-type semiconductor layer and the hole supply layer and is made from materials whose band gap is larger than that of the light emitting layer. For example, when the light emitting layer is in the MQW structure, the band gap of the p-type carrier blocking layer is larger than that of the barrier layer of the MQW structure to prevent electrons from escaping into the p-type semiconductor layer. Thus electron mobility is reduced and time of electrons retaining in the light emitting layer is increased. An n-type carrier blocking layer (such as n-AlGaN etc.) is disposed between the light emitting layer and the n-type semiconductor layer. Similarly, the n-type carrier blocking layer is made from materials whose band gap is larger than that of the light emitting layer for preventing holes from escaping into the n-type semiconductor layer. Thereby the electron-hole recombination rate is increased.

A semiconductor light emitting device including the above nitride semiconductor structure of the present invention includes a substrate disposed with the above nitride semiconductor structure, an n-type electrode and a p-type electrode used together for providing electric power. The Group IV-A element in the hole supply layer increases the hole concentration and reduces inactivation caused by Mg—H bonds so that Mg acceptors are activated and the hole supply layer has higher hole concentration. Thus more holes are provided to enter the light emitting layer and increase the electron-hole recombination. Therefore the semiconductor light emitting device has a lower resistance and provides a better light emitting efficiency.

In order to solve the problem of dislocation caused by lattice mismatch, a buffer layer is formed on surface of the substrate. The buffer layer is made from material $AlGa_yN_{1-y}$ (0<y<1).

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

In the following embodiments, when it is mentioned that a layer of something or a structure is disposed over or under a substrate, another layer of something, or another structure, that means the two structures, the layers of something, the layer of something and the substrate, or the structure and the substrate can be directly or indirectly connected. The indirect connection means there is at least one intermediate layer disposed therebetween.

Figure 1:
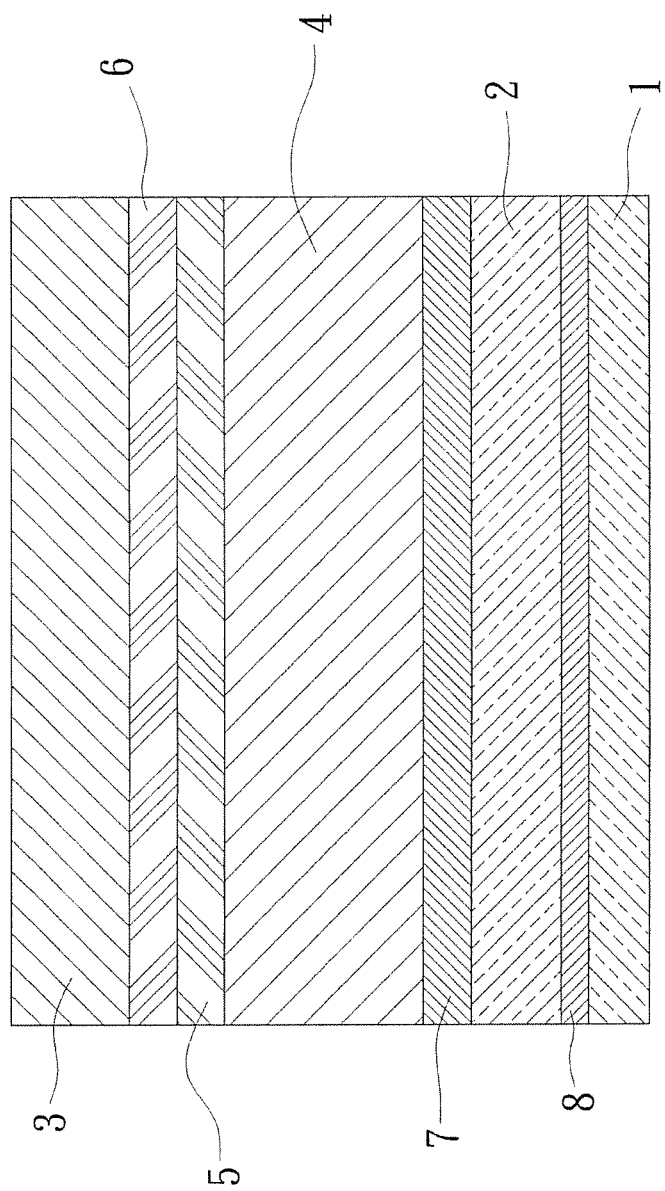
FIG. 1 is a schematic drawing showing a cross section of an embodiment of a nitride semiconductor structure according to the present invention.

Referring to FIG. 1, a schematic drawing showing a cross sectional view of an embodiment of a nitride semiconductor structure according to the present invention is revealed. The nitride semiconductor structure includes an n-type semiconductor layer 2, a p-type semiconductor layer 3, an light emitting layer 4 disposed between the n-type semiconductor layer 2 and the p-type semiconductor layer 3, and a hole supply layer 5 disposed between the light emitting layer 4 and the p-type semiconductor layer 3. The hole supply layer 5 is made from $In_xGa_{1-x}N$ and 0<x<1 while 0<x≤0.1 is preferred. Moreover, the hole supply layer 5 is doped with a Group IV-A element at a concentration ranging from $10^{17}$ to $10^{20}$ cm$^{-3}$ and carbon is a preferred dopant. In this embodiment, the n-type semiconductor layer 2 is an n-type GaN-based semiconductor layer while the p-type semiconductor layer 3 is a p-type GaN-based semiconductor layer.

Moreover, the hole supply layer 5 is doped with a p-type dopant (such as Mg) at a concentration higher than $10^{18}$ cm$^{-3}$ and a preferred thickness of the hole supply layer 5 is ranging from 1 nm to 100 nm.

Furthermore, the light emitting layer 4 has a multiple quantum well (MQW) structure formed by InGaN well layers and GaN barrier layers stacked alternately. As to the hole supply layer 5, its band gap is larger than that of the well layers of the MQW structure. Thus holes can enter the well layers of the MQW structure to increase the electron-hole recombination rate and further improve the light emitting efficiency.

In addition, a p-type carrier blocking layer 6 is disposed between the p-type semiconductor layer 3 and the hole supply layer 5 and is made from materials whose band gap is larger than that of the light emitting layer 4. In this embodiment, the material for the p-type carrier blocking layer 6 is p-type AlGaN (p-AlGaN) so as to prevent electrons from escaping into the p-type semiconductor layer 3. Thus electron mobility is reduced and time of electrons retaining in the light emitting layer 4 is increased. An n-type carrier blocking layer 7 is disposed between the light emitting layer 4 and the n-type semiconductor layer 2 and is made from materials whose band gap is larger than that of the light emitting layer 4. In this embodiment, the material for the n-type carrier blocking layer 7 is n-type AlGaN (n-AlGaN) for preventing holes from escaping into the n-type semiconductor layer 2.

While in use, the quinquevalent nitrogen atom is replaced by the Group IV-A element because that the hole supply layer 5 is doped with the Group IV-A element at a concentration ranging from $10^{17}$ to $10^{20}$ cm$^{-3}$. Thereby there is one more positively charged holes and the hole supply layer 5 has high concentration of holes. The above Group IV-A element can be carbon (C), silicon (Si), germanium (Ge), tin (Sn), lead (Pb), etc. while carbon is preferred. This is due to that the carbon reacts with hydrogen released from ammonia decomposition to form stable compound $CH_4$ and separated from the nitride semiconductor. The amount of hydrogen is reduced so that Mg—H bonds are also decreased. Thus Mg is in an ionic form and is active and the hole supply layer 5 has high concentration of holes. Thereby more holes are provided to enter the light emitting layer and the electron-hole recombination is further increased.

Figure 2:
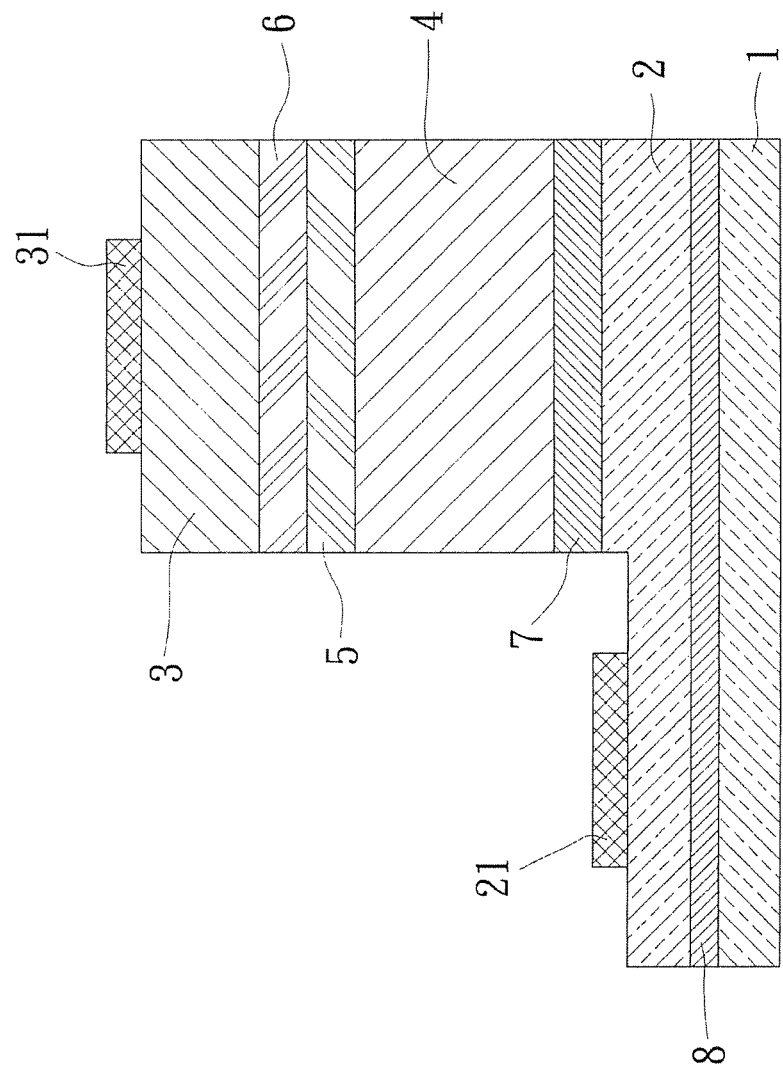
FIG. 2 is a schematic drawing showing a cross section of an embodiment of a semiconductor light emitting device including a nitride semiconductor structure according to the present invention.

The nitride semiconductor structure is applied to semiconductor light emitting devices. Referring to FIG. 2, a cross section of a semiconductor light emitting device including the above nitride semiconductor structure of an embodiment according to the present invention is revealed. The semiconductor light emitting device includes at least: a substrate 1, a n-type semiconductor layer 2 disposed over the substrate 1, a light emitting layer 4 disposed over the n-type semiconductor layer 2 and having a multiple quantum well (MQW) structure, a hole supply layer 5 disposed over the light emitting layer 4, a p-type semiconductor layer 3 disposed over the hole supply layer 5, a n-type electrode 21 disposed on and in ohmic contact with the n-type semiconductor layer 2, and a p-type electrode 31 disposed on and in ohmic contact with the p-type semiconductor layer 3.

The hole supply layer 5 is made from material $In_xGa_{1-x}N$ (0<x<1 while 0<x≤0.1 is preferred). Moreover, the hole supply layer 5 is doped with a Group IV-A element at a concentration ranging from $10^{17}$ to $10^{20}$ cm$^{-3}$ while carbon is preferred. Besides the Group IV-A element, the hole supply layer 5 is also doped with a p-type dopant (such as Mg) at a concentration higher than $10^{18}$ cm$^{-3}$. The optimal thickness of the hole supply layer 5 is ranging from 1 nm to 100 nm. The band gap of the hole supply layer 5 is larger than that of the well layers of the MQW structure.

The n-type electrode 21 and the p-type electrode 31 are used together to provide electric power and are made from (but not limited to) the following materials titanium, aluminum, gold, chromium, nickel, platinum, and their alloys. The manufacturing processes are well-known to people skilled in the art.

Furthermore, a p-type carrier blocking layer 6 is disposed between the p-type semiconductor layer 3 and the hole supply layer 5 while an n-type carrier blocking layer 7 is disposed between the light emitting layer 4 and the n-type semiconductor layer 2. Both the p-type carrier blocking layer 6 and the n-type carrier blocking layer 7 are made from materials whose band gap is larger than that of the light emitting layer 4. In addition, in order to solve the problem of dislocation caused by lattice mismatch, a buffer layer 8 is formed on the surface of the substrate 1. The buffer layer 8 is made from material $AlGa_yN_{1-y}$ (0<y<1).

In summary, the semiconductor light emitting device of the present invention uses the Group IV-A element as the dopant in the hole supply layer 5 to reduce inactivation caused by Mg—H bonds and activate Mg to act as acceptors. Thus the hole supply layer 5 has higher hole concentration and more holes are provided to enter the light emitting layer. The electron-hole recombination is increased and the semiconductor light emitting device has a lower resistance so as to get a better light emitting efficiency.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A nitride semiconductor structure comprising:
a n-type semiconductor layer, a p-type semiconductor layer, a light emitting layer disposed between the n-type semiconductor layer and the p-type semiconductor layer, and a hole supply layer disposed between the light emitting layer and the p-type semiconductor layer; wherein the hole supply layer is made from $In_xGa_{1-x}N$ and is doped with a Group IV-A element at a concentration ranging from $10^{17}$ to $10^{20}$ cm$^{-3}$, wherein $0<x<1$.

2. The nitride semiconductor structure as claimed in claim 1, wherein the Group IV-A element is carbon.

3. The nitride semiconductor structure as claimed in claim 1, wherein the hole supply layer is doped with a p-type dopant at a concentration higher than $10^{18}$ cm$^{-3}$.

4. The nitride semiconductor structure as claimed in claim 3, wherein the p-type dopant is magnesium.

5. The nitride semiconductor structure as claimed in claim 1, wherein the light emitting layer has a multiple quantum well (MQW) structure; a band gap of the hole supply layer is larger than a band gap of the well layer of the MQW structure.

6. The nitride semiconductor structure as claimed in claim 1, wherein a thickness of the hole supply layer is ranging from 1 nm to 100 nm.

7. The nitride semiconductor structure as claimed in claim 1, wherein the hole supply layer is made from $In_xGa_{1-x}N$, wherein $0<x\leq0.1$.

8. The nitride semiconductor structure as claimed in claim 1, wherein a p-type carrier blocking layer is disposed between the hole supply layer and the p-type semiconductor layer; the p-type carrier blocking layer is made from materials whose band gap is larger than a band gap of the light emitting layer.

9. The nitride semiconductor structure as claimed in claim 8, wherein a n-type carrier blocking layer is disposed between the light emitting layer and the n-type semiconductor layer; the n-type carrier blocking layer is made from materials whose band gap is larger than a band gap of the light emitting layer.

10. The nitride semiconductor structure as claimed in claim 1, wherein a n-type carrier blocking layer is disposed between the light emitting layer and the n-type semiconductor layer; the n-type carrier blocking layer is made from materials whose band gap is larger than a band gap of the light emitting layer.

11. A semiconductor light emitting device comprising:
a substrate;
a n-type semiconductor layer disposed over the substrate;
a light emitting layer disposed over the n-type semiconductor layer;
a hole supply layer disposed over the light emitting layer, made from $In_xGa_{1-x}N$ while $0<x<1$, and doped with a Group IV-A element at a concentration ranging from $10^{17}$ to $10^{20}$ cm$^{-3}$;
a p-type semiconductor layer disposed over the hole supply layer;
a n-type electrode disposed on and in ohmic contact with the n-type semiconductor layer; and
a p-type electrode disposed on and in ohmic contact with the p-type semiconductor layer.

* * * * *